US012615728B2

(12) United States Patent
Zhang et al.

(10) Patent No.: US 12,615,728 B2
(45) Date of Patent: Apr. 28, 2026

(54) COVER FOR DISPLAY PANEL, AND DISPLAY APPARATUS

(71) Applicant: BOE Technology Group Co., Ltd., Beijing (CN)

(72) Inventors: Xiongnan Zhang, Beijing (CN); Paoming Tsai, Beijing (CN); Yongxiang Shi, Beijing (CN); Ce Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 897 days.

(21) Appl. No.: 17/434,730

(22) PCT Filed: Dec. 2, 2020

(86) PCT No.: PCT/CN2020/133336
§ 371 (c)(1),
(2) Date: Aug. 27, 2021

(87) PCT Pub. No.: WO2022/116039
PCT Pub. Date: Jun. 9, 2022

(65) Prior Publication Data
US 2022/0354009 A1　Nov. 3, 2022

(51) Int. Cl.
*H05K 5/03* (2006.01)
*G02B 1/08* (2006.01)
(Continued)

(52) U.S. Cl.
CPC .................. *H05K 5/03* (2013.01); *G02B 1/08* (2013.01); *G02B 5/3083* (2013.01); *H05K 5/0018* (2022.08)

(58) Field of Classification Search
None
See application file for complete search history.

(56) References Cited

U.S. PATENT DOCUMENTS

2015/0029143 A1*　1/2015　Kang ...................... G09F 9/301
　　　　　　　　　　　　　　　　345/174
2015/0293390 A1*　10/2015　Tsunekawa ............. B32B 7/023
　　　　　　　　　　　　　　　　349/12
(Continued)

FOREIGN PATENT DOCUMENTS

CN　　102200605 A　　9/2011
CN　　204883473 U　* 12/2015　............... H05K 5/03
(Continued)

OTHER PUBLICATIONS

Fujikake, "Advanced flexible liquid-crystal display technologies," The International Society for Optics and Photonics (SPIE), Dec. 2, 2008 (Year: 2008).*

(Continued)

*Primary Examiner* — Frank J Vineis
*Assistant Examiner* — Nicole T Gugliotta
(74) *Attorney, Agent, or Firm* — Intellectual Valley Law, P.C.

(57) ABSTRACT

A cover for a display panel is provided. The cover for a display panel includes a cover film; a first adhesive layer on the cover film; a polarizer on a side of the first adhesive layer away from the cover film; a phase difference layer on a side of the polarizer away from the first adhesive layer; a second adhesive layer on a side of the phase difference layer away from the polarizer; and an ultra-thin glass and an opaque filler layer on a side of the second adhesive layer away from the phase difference layer. The opaque filler layer includes an opaque material. The opaque filler layer abuts at least a portion of a periphery of the ultra-thin glass.

20 Claims, 3 Drawing Sheets

(51) Int. Cl.
    *G02B 5/30*          (2006.01)
    *H05K 5/00*         (2025.01)

(56)           References Cited

U.S. PATENT DOCUMENTS

| | | |
|---|---|---|
| 2016/0062166 A1 | 3/2016 | Kim et al. |
| 2017/0023718 A1* | 1/2017 | Son .......................... G02B 1/08 |
| 2018/0063980 A1* | 3/2018 | Shin ........................ B32B 7/022 |
| 2018/0150105 A1 | 5/2018 | Hwang et al. |
| 2020/0075895 A1 | 3/2020 | Oh et al. |
| 2020/0194724 A1 | 6/2020 | Ahn et al. |
| 2020/0329575 A1* | 10/2020 | Park ...................... G06F 1/1652 |
| 2022/0418118 A1* | 12/2022 | Sim ....................... G06F 1/1681 |
| 2023/0199989 A1* | 6/2023 | Yee ......................... B32B 37/12 |
| | | 156/249 |
| 2023/0301004 A1* | 9/2023 | Lee ........................ B32B 17/10 |
| | | 361/807 |
| 2024/0132392 A1* | 4/2024 | Lee .......................... B32B 7/12 |
| 2024/0196554 A1* | 6/2024 | Liu ......................... B32B 27/40 |

FOREIGN PATENT DOCUMENTS

| | | | | |
|---|---|---|---|---|
| CN | 105388659 A | 3/2016 | | |
| CN | 107369385 A | 11/2017 | | |
| CN | 107545848 A | 1/2018 | | |
| CN | 108874212 A | 11/2018 | | |
| CN | 109940948 A | 6/2019 | | |
| CN | 109979342 A | 7/2019 | | |
| CN | 209765932 U | 12/2019 | | |
| CN | 110874985 A | 3/2020 | | |
| CN | 111176490 A | 5/2020 | | |
| CN | 111312065 A | 6/2020 | | |
| CN | 211087782 U | 7/2020 | | |
| JP | 2018120018 A | * | 8/2018 | .......... G06F 3/0412 |
| WO | WO-2019035421 A1 | * | 2/2019 | .............. H05K 3/10 |

OTHER PUBLICATIONS

International Search Report & Written Opinion mailed Aug. 27, 2021, regarding PCT/CN2020/133336.
Wei W. et al., "Fabrication technology for Liquid Crystal Device", pp. 160-163, Aviation Industry Press, English Translation attached.

* cited by examiner

COVER FOR DISPLAY PANEL, AND DISPLAY APPARATUS

CROSS-REFERENCE TO RELATED APPLICATION

This application is a national stage application under 35 U.S.C. § 371 of International Application No. PCT/CN2020/133336, filed Dec. 2, 2020, the contents of which are incorporated by reference in the entirety.

TECHNICAL FIELD

The present invention relates to the field of display technology, more particularly, to a cover for a display panel, and a display apparatus.

BACKGROUND

A flexible display apparatus is a bendable or deformable display apparatus having a flexible display panel. Examples of flexible display apparatuses include a flexible organic light emitting diode (OLED) display apparatus, a flexible electrophoretic display (EPD) apparatus, and a flexible liquid crystal display (LCD) apparatus. As a new generation display apparatus, the flexible display apparatus is thinner and lighter, having high contrast, high responsiveness, and high brightness. It also provides full color and a wide viewing angle. The flexible display apparatus has found a wide range of applications in mobiles phones, personal digital assistance (PDAs), digital cameras, on-board displays, notebook computers, on-wall televisions, as well as various military applications. A flexible display apparatus includes a flexible array substrate. A base substrate of the flexible array substrate can be made of flexible material such as plastic.

SUMMARY

In one aspect, the present disclosure provides a cover for a display panel, comprising a cover film; a first adhesive layer on the cover film; a polarizer on a side of the first adhesive layer away from the cover film; a phase difference layer on a side of the polarizer away from the first adhesive layer; a second adhesive layer on a side of the phase difference layer away from the polarizer; and an ultra-thin glass and an opaque filler layer on a side of the second adhesive layer away from the phase difference layer; wherein the opaque filler layer comprises an opaque material; and the opaque filler layer abuts at least a portion of a periphery of the ultra-thin glass.

Optionally, an orthographic projection of the second adhesive layer on a plane containing a surface of the cover film covers an orthographic projection of the ultra-thin glass on the plane containing the surface of the cover film with a margin; and an orthographic projection of the opaque filler layer on the plane containing the surface of the cover film is at least partially in the margin.

Optionally, the orthographic projection of the second adhesive layer on the plane containing the surface of the cover film substantially overlaps with an orthographic projection of a combination of the orthographic projection of the ultra-thin glass and the orthographic projection of the opaque filler layer on the plane containing the surface of the cover film.

Optionally, the opaque filler layer has a first thickness equal to or greater than a second thickness of the ultra-thin glass.

Optionally, the first thickness is greater than the second thickness; and an orthographic projection of the opaque filler layer partially overlaps with an orthographic projection of the ultra-thin glass.

Optionally, the first thickness is greater than the second thickness; and a difference between the first thickness and the second thickness being less than 50 μm.

Optionally, a thickness of the ultra-thin glass is in a range of 30 μm to 100 μm; and a ratio of a thickness of the opaque filler layer to the thickness of the ultra-thin glass is in a range of 2.5 to 3.5.

Optionally, the cover is bendable along a bending direction; and an absorption axis of the polarizer is substantially perpendicular to the bending direction.

Optionally, the polarizer is an iodine-based linear polarizer.

Optionally, the phase difference layer comprises a half wave plate and a quarter wave plate.

Optionally, a total thickness of the cover is in a range of 50 μm to 150 μm; a thickness of the cover film is in a range of 50 μm to 100 μm; a thickness of the first adhesive layer is in a range of 0.1 μm to 25 μm; a thickness of the polarizer is in a range of 1 μm to 15 μm; a thickness of the phase difference layer is in a range of 0.05 μm to 5 μm; a thickness of the second adhesive layer is in a range of 3 μm to 25 μm; and a thickness of the ultra-thin glass is in a range of 30 μm to 100 μm.

In one aspect, the present disclosure provides a display apparatus, comprising a cover; and a display panel; wherein the cover comprises a cover film; a first adhesive layer on the cover film; a polarizer on a side of the first adhesive layer away from the cover film; a phase difference layer on a side of the polarizer away from the first adhesive layer; a second adhesive layer on a side of the phase difference layer away from the polarizer; and an ultra-thin glass and an opaque filler layer on a side of the second adhesive layer away from the phase difference layer; wherein the opaque filler layer comprises an opaque material; and the opaque filler layer abuts at least a portion of a periphery of the ultra-thin glass.

Optionally, the display apparatus further comprises a third adhesive layer between the ultra-thin glass and the display panel.

Optionally, an orthographic projection of the second adhesive layer on a plane containing a surface of the cover film covers an orthographic projection of the ultra-thin glass on the plane containing the surface of the cover film with a margin; and an orthographic projection of the opaque filler layer on the plane containing the surface of the cover film is at least partially in the margin.

Optionally, the orthographic projection of the second adhesive layer on the plane containing the surface of the cover film substantially overlaps with an orthographic projection of a combination of the orthographic projection of the ultra-thin glass and the orthographic projection of the opaque filler layer on the plane containing the surface of the cover film.

Optionally, the opaque filler layer has a first thickness equal to or greater than a second thickness of the ultra-thin glass.

Optionally, the first thickness is greater than the second thickness; and an orthographic projection of the opaque filler layer partially overlaps with an orthographic projection of the ultra-thin glass.

Optionally, the first thickness is greater than the second thickness; and a difference between the first thickness and the second thickness being less than 50 μm.

Optionally, a thickness of the ultra-thin glass is in a range of 30 μm to 100 μm; and a ratio of a thickness of the opaque filler layer to the thickness of the ultra-thin glass is in a range of 2.5 to 3.5.

Optionally, the cover is bendable along a bending direction; and an absorption axis of the polarizer is substantially perpendicular to the bending direction.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a cover for a display panel, and a display apparatus that substantially obviate one or more of the problems due to limitations and disadvantages of the related art. In one aspect, the present disclosure provides a cover for a display panel. In some embodiments, the cover includes a cover for a display panel. In some embodiments, the cover for a display panel includes a cover film; a first adhesive layer on the cover film; a polarizer on a side of the first adhesive layer away from the cover film, the first adhesive layer adhering the cover film and the polarizer together; a phase difference layer on a side of the polarizer away from the first adhesive layer; a second adhesive layer on a side of the phase difference layer away from the polarizer; and an ultra-thin glass and an opaque filler layer on a side of the second adhesive layer away from the phase difference layer, the second adhesive layer adhering the ultra-thin glass and the phase difference layer together and adhering the opaque filler layer and the phase difference layer together. Optionally, the opaque filler layer comprises an opaque material. Optionally, the opaque filler layer abuts at least a portion of a periphery of the ultra-thin glass.

Figure 1:
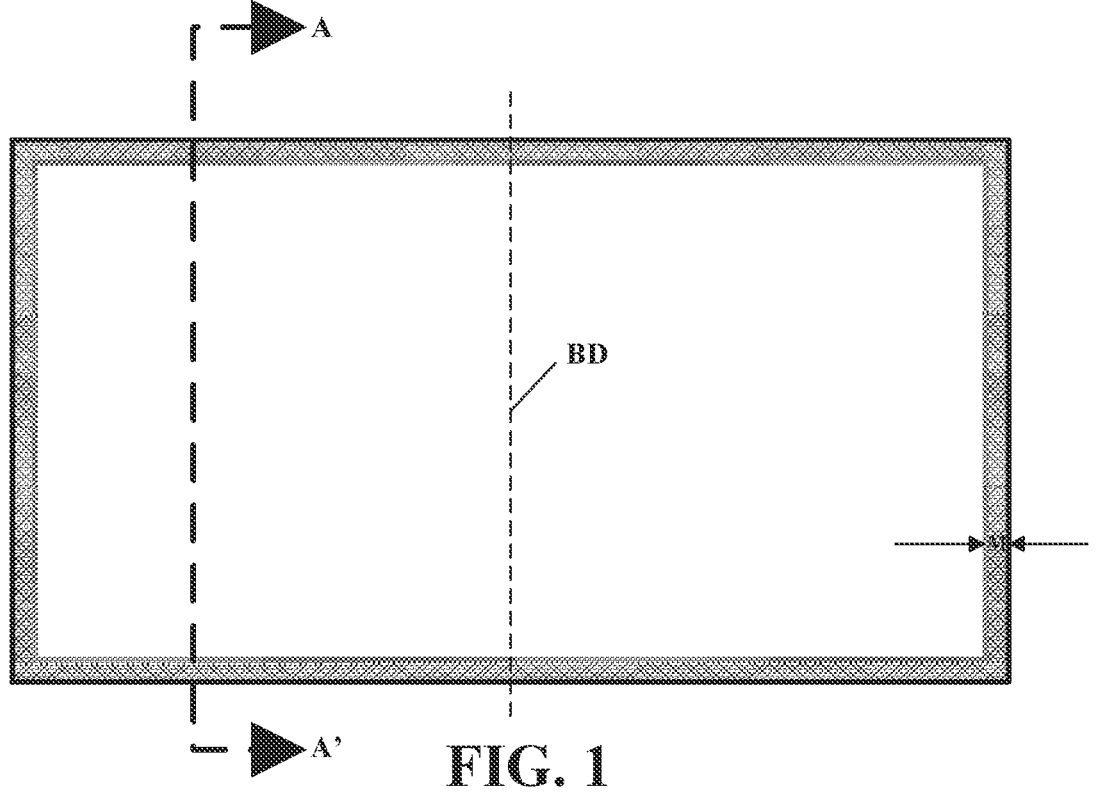
FIG. 1 is a plan view of a cover for a display panel in some embodiments according to the present disclosure.
Figure 2:
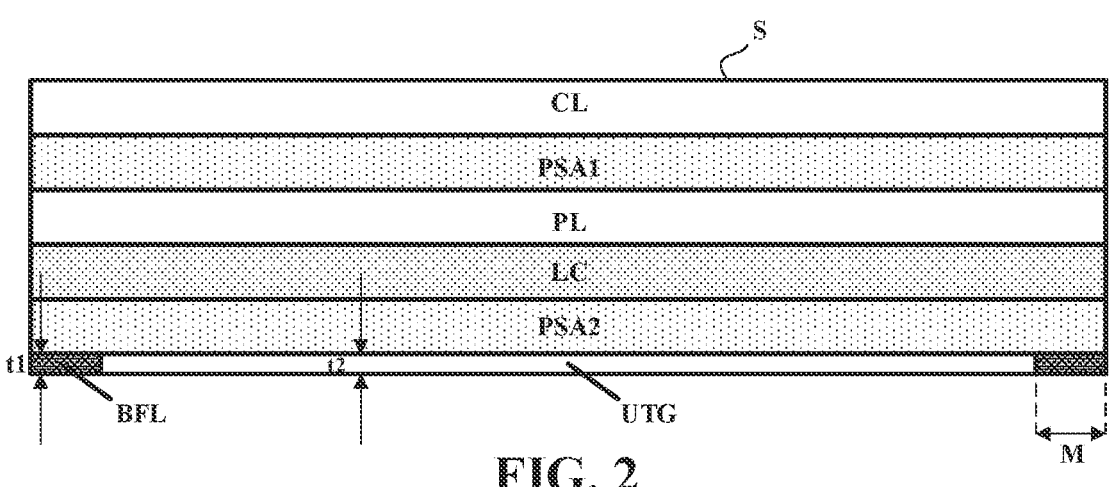
FIG. 2 is a cross-sectional view along an A-A' line in FIG. 1.

FIG. 1 is a plan view of a cover for a display panel in some embodiments according to the present disclosure. FIG. 2 is a cross-sectional view along an A-A' line in FIG. 1. Referring to FIG. 1, the cover in some embodiments includes a cover film CL; a first adhesive layer PSA1 on the cover film CL; a polarizer PL on a side of the first adhesive layer PSA1 away from the cover film CL; a phase difference layer LC on a side of the polarizer PL away from the first adhesive layer PSA1; a second adhesive layer PSA2 on a side of the phase difference layer LC away from the polarizer PL; and an ultra-thin glass UTG and an opaque filler layer BFL on a side of the second adhesive layer PSA2 away from the phase difference layer LC. Optionally, the first adhesive layer PDS adheres the cover film CL and the polarizer PL together, for example, the first adhesive layer PDS is in direct contact with the cover film CL and in direct contact with the polarizer PL. Optionally, the second adhesive layer PSA2 adheres the ultra-thin glass UTG and the phase difference layer LC together and adheres the opaque filler layer BFL and the phase difference layer LC together. For example, the second adhesive layer PSA2 is in direct contact with the ultra-thin glass UTG, in direct contact with the opaque filler layer BFL, and in direct contact with the phase difference layer LC.

The inventors of the present disclosure discover that, surprisingly and unexpectedly, an ultra-thin cover for display panel with superior bending flexibility can be achieved according to the present disclosure. A total thickness of the cover in the present disclosure can be made in a range of 50 μm to 150 μm. The cover is particularly resistant to crack due to repeated bending and stretching action. Moreover, by having the intricate stacked structure according to the present disclosure, the cover is made to be highly durable with an improved resistance to impact, particularly along an edge of the cover.

In some embodiments, the opaque filler layer BFL includes an opaque material. Various appropriate opaque filler materials and various appropriate fabricating methods may be used to make the opaque filler layer BFL. For example, an opaque filler material may be deposited on the substrate (e.g., by sputtering, vapor deposition, solution coating, or spin coating); and patterned (e.g., by lithography such as a wet etching process) to form the opaque filler layer BFL. Examples of appropriate opaque filler materials for making the opaque filler layer BFL include, but are not limited to, black silicone, black polyimide, black inks, and black curing adhesives. The opaque filler layer BFL effectively protects the ultra-thin glass UTG, making the cover highly resistant to impact, particularly along an edge of the ultra-thin glass UTG.

In some embodiments, the opaque filler layer BFL abuts at least a portion of a periphery of the ultra-thin glass UTG. In one example, the opaque filler layer BFL abuts an entirety of the periphery of the ultra-thin glass UTG, e.g., surrounding the periphery of the ultra-thin glass UTG, as shown in FIG. 1. Optionally, an orthographic projection of the second adhesive layer PSA2 on a plane containing a surface S of the cover film CL covers an orthographic projection of the ultra-thin glass UTG on the plane containing the surface S of the cover film CL with a margin M. Optionally, an orthographic projection of the opaque filler layer BFL on the plane containing the surface S of the cover film CL is at least partially in the margin M, for example, is limited in the margin M as shown in FIG. 2. In one example, the orthographic projection of the second adhesive layer PSA2 on the plane containing the surface S of the cover film CL substantially overlaps with an orthographic projection of a combination of the orthographic projection of the ultra-thin glass UTG and the orthographic projection of the opaque filler layer BFL on the plane containing the surface S of the cover film CL.

Optionally, the margin M has a width in a range of 0.1 mm to 5 mm, e.g., 0.1 mm to 1 mm, 1 mm to 2 mm, 2 mm to 3 mm, 3 mm to 4 mm, or 4 mm to 5 mm.

In some embodiments, the opaque filler layer BFL has a first thickness t1 equal to or greater than a second thickness t2 of the ultra-thin glass UTG. In one example, as shown in FIG. 2, the first thickness t1 equals to the second thickness t2. An orthographic projection of the ultra-thin glass UTG on the plane containing the surface S of the cover film CL is substantially non-overlapping with an orthographic projection of opaque filler layer PSA1 on the plane containing the surface S of the cover film CL.

Figure 3:
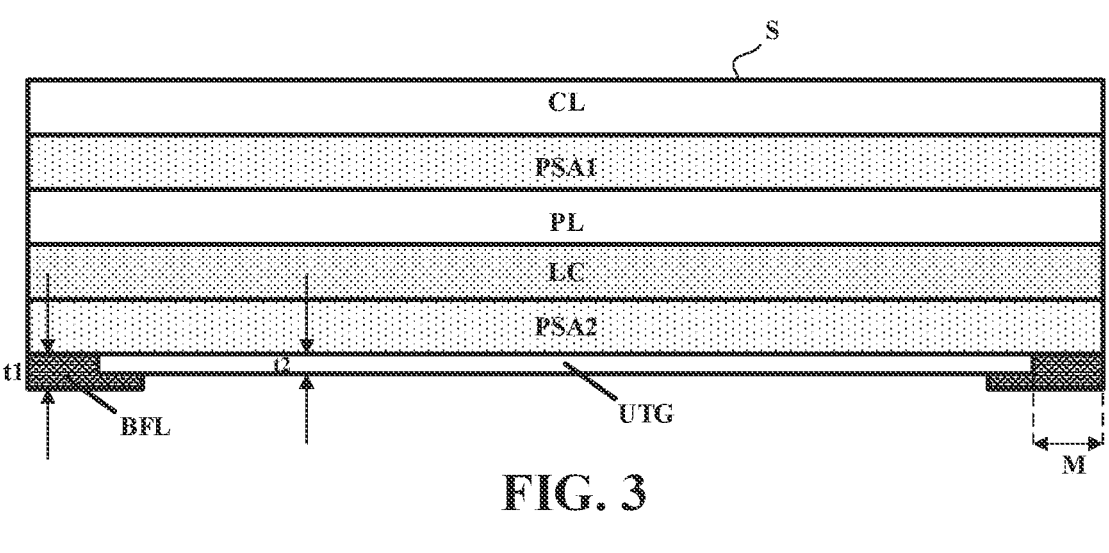
FIG. 3 is a cross-sectional view of a cover for a display panel in some embodiments according to the present disclosure.

FIG. 3 is a cross-sectional view of a cover for a display panel in some embodiments according to the present disclosure. Referring to FIG. 3, the first thickness t1 is greater than the second thickness 2. Optionally, the orthographic projection of the opaque filler layer BFL on the plane containing the surface S of the cover film CL is partially in the margin M, and partially outside the margin M. A part of the opaque filler layer BFL whose orthographic projection on the plane containing the surface S of the cover film CL is outside the margin M is on a side of the ultra-thin glass UTG away from the second adhesive layer PSA2, for example, covering an edge of the ultra-thin glass UTG to enhance its impact resistance.

In some embodiments, the opaque filler layer BFL has a first thickness t1 equal to or greater than a second thickness t2 of the ultra-thin glass UTG, and a difference between the first thickness t1 and the second thickness t2 is less than 50 μm. This implementation further minimizes the total thickness of the cover. In some embodiments, the thickness of the ultra-thin glass is in a range of 30 μm to 100 μm, e.g., 30 μm to 40 μm, 40 μm to 50 μm, 50 μm to 60 μm, 60 μm to 70 μm, 70 μm to 80 μm, 80 μm to 90 μm, or 90 μm to 100 μm. Optionally, a ratio of the first thickness t1 of the opaque filler layer BFL to the second thickness t2 of the ultra-thin glass UTG is in a range of 2.5 to 3.5, e.g., 2.5 to 3.0, or 3.0 to 3.5.

In some embodiments, and referring to FIG. 1, the cover is bendable along a bending direction BD. Optionally, an absorption axis of the polarizer PL is substantially perpendicular to the bending direction BD. As used herein, the term "substantially perpendicular" means that an angle is in the range of approximately 80 degrees to approximately 100 degrees, e.g., approximately 80 degrees to approximately 85 degrees, approximately 85 degrees to approximately 90 degrees, approximately 90 degrees to approximately 95 degrees, or approximately 95 degrees to approximately 100 degrees.

Various appropriate polarizers may be used in the present disclosure. In some embodiments, the polarizer PL is a linear polarizer. In some embodiments, the polarizer PL is an iodine-based polarizer. Optionally, the iodine-based polarizer includes iodine and/or iodine ions. In one example, the iodine-based polarizer is formed by uniaxially stretching a polyvinyl alcohol-based film dyed with iodine.

Figure 4:
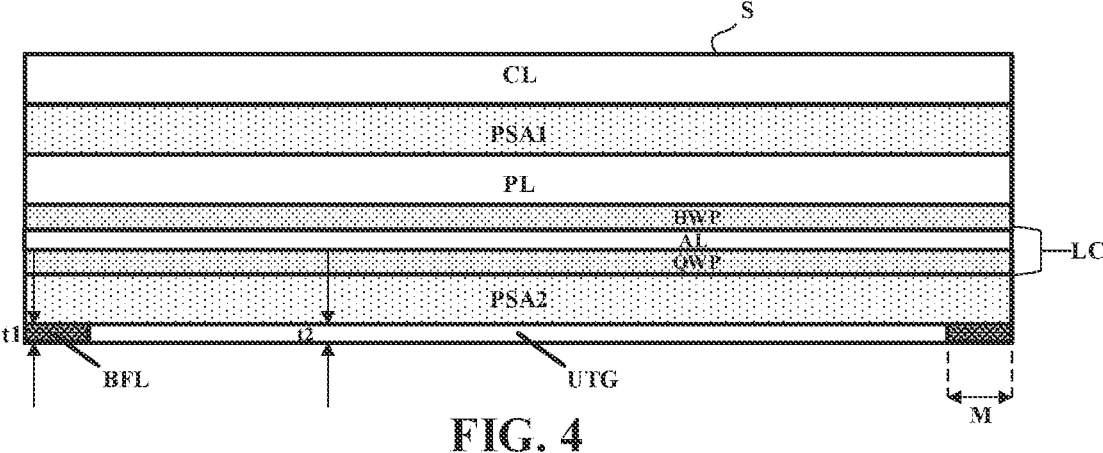
FIG. 4 is a cross-sectional view of a cover for a display panel in some embodiments according to the present disclosure.

In some embodiments, the phase difference layer LC includes a half wave plate and a quarter wave plate. FIG. 4 is a cross-sectional view of a cover for a display panel in some embodiments according to the present disclosure. Referring to FIG. 4, in some embodiments, the phase difference layer LC includes a quarter wave plate QWP on a side of the second adhesive layer PSA2 away from the ultra-thin glass UTG, a half wave plate HWP on a side of the quarter wave plate QWP away from the second adhesive layer PSA2. The polarizer PL is on a side of the half wave plate HWP away from the quarter wave plate QWP. Optionally, the phase difference layer LC further includes an adhesive layer AL adhering the quarter wave plate QWP and the half wave plate HWP together.

In some embodiments, an incident light passes through the polarizer PL (e.g., a linear polarizer) and is linearly polarized. In some embodiments, the half wave plate HWP has its optics axis set at an angle α with respect to the transmission axis of the polarizer PL. When the linearly polarized light from the polarizer PL passes through the half wave plate HWP, the plane of polarization of the light will be rotated by 2α. The quarter wave plate QWP has its optics axis set at an angle of 2α plus 45 degrees, with respect to the transmission axis of the polarizer PL. When the linearly polarized light from the half wave plate HWP enters into the quarter wave plate QWP, it is converted into circularly polarized light, e.g., left circularly polarized light. The left circularly polarized light is then reflected (e.g., from a metal pattern in a display apparatus having the cover) and is converted into right circularly polarized light. The reflected, right circularly polarized light enters into the quarter wave plate QWP. The right circularly polarized light is circularly polarized a second time by the quarter wave plate QWP, and is now converted into linearly polarized light having a polarization direction perpendicular to the transmission axis of the polarizer PL. As a result, no reflected light passes through the polarizer PL.

In some embodiments, a is in a range of 14 degrees to 16 degrees, for example 15 degrees. In one example, the half wave plate HWP has its optics axis set at 15 degrees with respect to the transmission axis of the polarizer PL, and the quarter wave plate QWP has its optics axis set at 75 degrees with respect to the transmission axis of the polarizer PL. When light passes through the polarizer PL, it becomes vertically polarized. The vertically polarized light is converted into left circularly polarized light after it passes through the half wave plate HWP and the quarter wave plate QWP. The left circularly polarized light becomes right circularly polarized light after it is reflected by the metal pattern. Subsequently, the right circularly polarized light passes through the quarter wave plate QWP and the half wave plate HWP, and is now converted into horizontally polarized light, the direction of which is vertical to the transmission axis of the polarizer PL. Thus, the horizontally polarized light cannot pass through the polarizer PL.

The inventors of the present disclosure discover that, by integrating the polarizer PL, the half wave plate HWP, and the quarter wave plate QWP into the cover, the cover of the present disclosure can achieve an excellent anti-glare ability, and at the same time an enhanced resistance to impact.

Various appropriate materials may be used for making the half wave plate HWP and the quarter wave plate QWP. In one example, each of the half wave plate HWP and the quarter wave plate QWP includes a liquid crystal material. Examples of appropriate liquid crystal materials for making the half wave plate HWP and the quarter wave plate QWP include nematic liquid crystal materials, cholesteric liquid crystal materials, and quasi-crystalline liquid crystal materials.

Various appropriate materials and various appropriate fabricating methods may be used to make the first adhesive layer PSA1 and the second adhesive layer PSA2. For example, a pressure sensitive adhesive material may be used to form the first adhesive layer PSA1 and/or the second adhesive layer PSA2. Examples of appropriate pressure sensitive adhesive materials include, but are not limited to, an acrylate-based adhesive material, such as homopolymers and copolymers of acrylic acid, methacrylic acid, isooctyl acrylate, acrylamide, methacrylamide, acrylonitrile, methacrylonitrile, methyl isoamyl acrylate, 2-ethyl hexylacrylate, and butyl acrylate.

Various appropriate materials and various appropriate fabricating methods may be used to make the cover film CL. Examples of appropriate materials for making the cover film CL include, but are not limited to, polyamine such as colorless polyamine (CPI), thin glass, ultrathin glass, polyethylene terephthalate (PET), polyacrylate, polymethylmethacrylate (PMMA), polycarbonate (PC), polyethylene naphthalate, polyvinylidene chloride, polyvinylidene difluoride, polystyrene, an ethylene vinyl alcohol copolymer, ultra-thin glass (UTG), or any combination thereof. Optionally, the cover film CL is made of a flexible polymer material. Optionally, the cover film CL is made of a flexible inorganic material. Optionally, the cover film CL further includes a hard coating sub-layer.

In some embodiments, a total thickness of the cover is in a range of 50 μm to 150 μm, e.g., 50 μm to 60 μm, 60 μm to 70 μm, 70 μm to 80 μm, 80 μm to 90 μm, 90 μm to 100 μm, 100 μm to 110 μm, 110 μm to 120 μm, 120 μm to 130 μm, 130 μm to 140 μm, or 140 μm to 150 μm. Optionally, a thickness of the cover film is in a range of 50 μm to 100 μm. e.g., 50 μm to 60 μm, 60 μm to 70 μm, 70 μm to 80 μm, 80 μm to 90 μm, or 90 μm to 100 μm. Optionally, a thickness of the first adhesive layer is in a range of 0.1 μm to 25 μm, e.g., 0.1 μm to 1 μm, 1 μm to 5 μm, 5 μm to 10 μm, 10 μm to 15 μm, 15 μm to 20 μm, or 20 μm to 25 μm. Optionally, a thickness of the polarizer is in a range of 1 μm to 15 μm, e.g., 1 μm to 5 μm, 5 μm to 10 μm, or 10 μm to 15 μm. Optionally, a thickness of the phase difference layer is in a range of 0.05 μm to 5 μm, e.g., 0.05 μm to 1 μm, 1 μm to 2 μm, 2 μm to 3 μm, 3 μm to 4 μm, or 4 μm to 5 μm. Optionally, a thickness of the second adhesive layer is in a range of 3 μm to 25 μm, e.g., 3 μm to 5 μm, 5 μm to 10 μm, 10 μm to 15 μm, 15 μm to 20 μm, or 20 μm to 25 μm. Optionally, a thickness of the ultra-thin glass is in a range of 30 μm to 100 μm. e.g., 3 μm to 5 μm, 5 μm to 10 μm, 10 μm to 20 μm, 20 μm to 30 μm, 30 μm to 40 μm, 40 μm to 50 μm, 50 μm to 60 μm, 60 μm to 70 μm, 70 μm to 80 μm, 80 μm to 90 μm, or 90 μm to 100 μm. Optionally, the hard coating sub-layer has a thickness in a range of 5 μm to 15 μm, e.g., 5 μm to 10 μm, or 10 μm to 15 μm.

Figure 5:
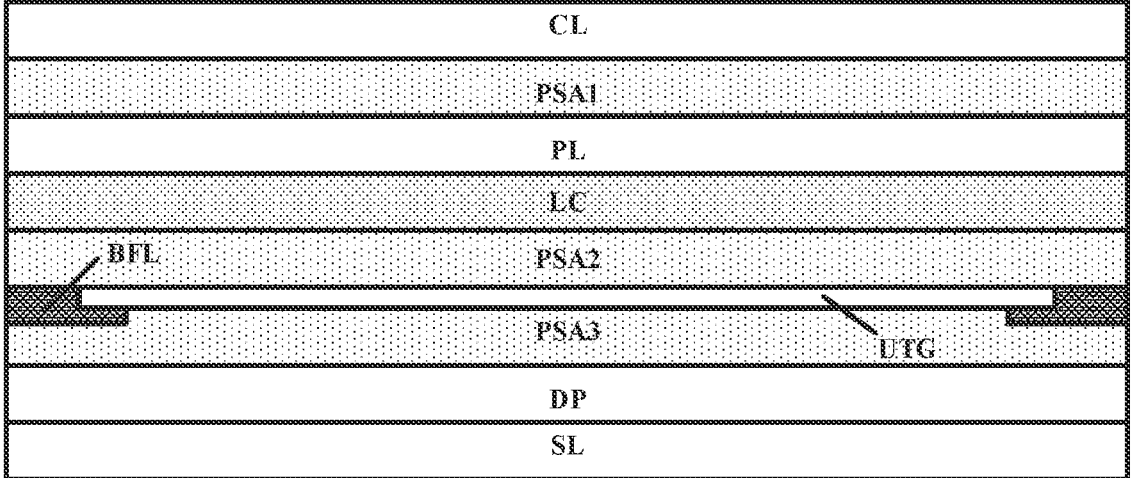
FIG. 5 is a cross-sectional view of a display apparatus for a display panel in some embodiments according to the present disclosure.

In another aspect, the present disclosure provides a display apparatus. FIG. 5 is a cross-sectional view of a display apparatus for a display panel in some embodiments according to the present disclosure. In some embodiment, and referring to FIG. 5, the display apparatus includes a display panel DP and a cover. Referring to FIG. 5, the cover in some embodiments includes a cover film CL; a first adhesive layer PSA1 on the cover film CL; a polarizer PL on a side of the first adhesive layer PSA1 away from the cover film CL; a phase difference layer LC on a side of the polarizer PL away from the first adhesive layer PSA1; a second adhesive layer PSA2 on a side of the phase difference layer LC away from the polarizer PL; and an ultra-thin glass UTG and an opaque filler layer BFL on a side of the second adhesive layer PSA2 away from the phase difference layer LC. Optionally, the first adhesive layer PDS adheres the cover film CL and the polarizer PL together, for example, the first adhesive layer PDS is in direct contact with the cover film CL and in direct contact with the polarizer PL. Optionally, the second adhesive layer PSA2 adheres the ultra-thin glass UTG and the phase difference layer LC together and adheres the opaque filler layer BFL and the phase difference layer LC together. For example, the second adhesive layer PSA2 is in direct contact with the ultra-thin glass UTG, in direct contact with the opaque filler layer BFL, and in direct contact with the phase difference layer LC.

In some embodiments, the display apparatus further includes a third adhesive layer PSA3 between the ultra-thin glass UTG and the display panel DP. Optionally, the third adhesive layer PSA3 adheres the ultra-thin glass UTG and the display panel DP together. Optionally, the third adhesive layer PSA3 is in direct contact with the ultra-thin glass UTG, and in direct contact with the opaque filler layer BFL. Optionally, the opaque filler layer BFL is disposed in a region corresponding to a peripheral area of the display panel. As used herein the term "peripheral area" refers to an area of a display panel where various circuits and wires are provided to transmit signals to the display panel. To increase the transparency of the display panel, non-transparent or opaque components of the display panel (e.g., battery, printed circuit board, metal frame), can be disposed in the peripheral area rather than in the display areas.

In some embodiments, the display apparatus further includes a back support layer SL on a side of the display panel DP away from the third adhesive layer PSA3. The back support layer SL may be a flexible support layer such as a layer made of a flexible polymer material.

Optionally, the display panel DP is an organic light emitting diode display panel. Optionally, the display panel DP is a liquid crystal display panel.

Examples of appropriate display apparatuses include, but are not limited to, an electronic paper, a mobile phone, a tablet computer, a television, a monitor, a notebook computer, a digital album, a GPS, etc. Optionally, the display apparatus further includes one or more integrated circuits connected to the display panel.

In another aspect, the present disclosure further provides a method of fabricating a cover for display panel, and a method of fabricating a display apparatus. In some embodiments, the method of fabricating the cover includes providing a cover film, a polarizer, and an ultra-thin glass; forming a first adhesive layer adhering the cover film and the polarizer together; forming a phase difference layer on the polarizer; forming a second adhesive layer adhering the phase difference layer and the ultra-thin glass together; and forming an opaque filler layer abutting at least a portion of a periphery of the ultra-thin glass. The opaque filler layer includes an opaque material. The cover of the present disclosure is formed as an integrated unit for subsequent fabrication of a display apparatus. Thus, fabrication of the display apparatus can be much simplified.

In some embodiments, the method of fabricating the display apparatus includes providing the cover described in the present disclosure or fabricated by a method of the present disclosure; providing a display panel; and adhering the cover and the display panel by forming a third adhesive layer between the cover and the display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated.

It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A cover for a display panel, comprising:
a cover film;
a first adhesive layer on the cover film;
a polarizer on a side of the first adhesive layer away from the cover film;
a phase difference layer on a side of the polarizer away from the first adhesive layer;
a second adhesive layer on a side of the phase difference layer away from the polarizer; and
a glass and an opaque filler layer on a side of the second adhesive layer away from the phase difference layer;
wherein the opaque filler layer comprises an opaque material;
the opaque filler layer abuts at least a portion of a periphery of the glass;
the opaque filler layer is in direct contact with the glass, and in direct contact with the second adhesive layer;
an orthographic projection of the second adhesive layer on a plane containing a surface of the cover film covers an orthographic projection of the glass on the plane containing the surface of the cover film with a margin;
the orthographic projection of the opaque filler layer on the plane containing the surface of the cover film is partially in the margin, and partially outside the margin;
a first part of the opaque filler layer whose orthographic projection on the plane containing the surface of the cover film is outside the margin is on a side of the glass away from the second adhesive layer, and is in direct contact with the glass.

2. The cover of claim 1, wherein a second part of the opaque filler layer whose orthographic projection on the plane containing the surface of the cover film is in the margin is in direct contact with a side of the glass and in direct contact with the second adhesive layer; and
the first part has a thickness greater than a thickness of the second part.

3. The cover of claim 2, wherein the orthographic projection of the second adhesive layer on the plane containing the surface of the cover film substantially overlaps with an orthographic projection of a combination of the orthographic projection of the glass and the orthographic projection of the opaque filler layer on the plane containing the surface of the cover film.

4. The cover of claim 1, wherein the opaque filler layer has a first thickness equal to or greater than a second thickness of the glass.

5. The cover of claim 4, wherein the first thickness is greater than the second thickness; and
an orthographic projection of the opaque filler layer partially overlaps with an orthographic projection of the glass.

6. The cover of claim 4, wherein the first thickness is greater than the second thickness; and
a difference between the first thickness and the second thickness being less than 50 µm.

7. The cover of claim 1, wherein a thickness of the glass is in a range of 30 µm to 100 µm; and
a ratio of a thickness of the opaque filler layer to the thickness of the glass is in a range of 2.5 to 3.5.

8. The cover of claim 1, wherein the cover is bendable along a bending direction; and
an absorption axis of the polarizer is substantially perpendicular to the bending direction.

9. The cover of claim 1, wherein the polarizer is an iodine-based linear polarizer.

10. The cover of claim 1, wherein the phase difference layer comprises a half wave plate and a quarter wave plate.

11. The cover of claim 1, wherein a thickness of the cover film is in a range of 50 µm to 100 µm;
a thickness of the first adhesive layer is in a range of 0.1 µm to 25 µm;
a thickness of the polarizer is in a range of 1 µm to 15 µm;
a thickness of the phase difference layer is in a range of 0.05 µm to 5 µm;
a thickness of the second adhesive layer is in a range of 3 µm to 25 µm; and
a thickness of the glass is in a range of 30 µm to 100 µm.

12. A display apparatus, comprising:
a cover; and
a display panel;
wherein the cover comprises:
a cover film;
a first adhesive layer on the cover film;
a polarizer on a side of the first adhesive layer away from the cover film;
a phase difference layer on a side of the polarizer away from the first adhesive layer;
a second adhesive layer on a side of the phase difference layer away from the polarizer; and
a glass and an opaque filler layer on a side of the second adhesive layer away from the phase difference layer;
wherein the opaque filler layer comprises an opaque material;
the opaque filler layer abuts at least a portion of a periphery of the glass;
the opaque filler layer is in direct contact with the glass, and in direct contact with the second adhesive layer;
an orthographic projection of the second adhesive layer on a plane containing a surface of the cover film covers an orthographic projection of the glass on the plane containing the surface of the cover film with a margin;
the orthographic projection of the opaque filler layer on the plane containing the surface of the cover film is partially in the margin, and partially outside the margin;
a first part of the opaque filler layer whose orthographic projection on the plane containing the surface of the cover film is outside the margin is on a side of the glass away from the second adhesive layer.

13. The display apparatus of claim 12, further comprising a third adhesive layer between the glass and the display panel.

14. The display apparatus of claim 12, wherein a second part of the opaque filler layer whose orthographic projection on the plane containing the surface of the cover film is in the margin is in direct contact with a side of the glass and in direct contact with the second adhesive layer; and the first part has a thickness greater than a thickness of the second part.

15. The display apparatus of claim 14, wherein the orthographic projection of the second adhesive layer on the plane containing the surface of the cover film substantially overlaps with an orthographic projection of a combination of the orthographic projection of the glass and the orthographic projection of the opaque filler layer on the plane containing the surface of the cover film.

16. The display apparatus of claim 12, wherein the opaque filler layer has a first thickness equal to or greater than a second thickness of the glass.

17. The display apparatus of claim 16, wherein the first thickness is greater than the second thickness; and an orthographic projection of the opaque filler layer partially overlaps with an orthographic projection of the glass.

18. The display apparatus of claim 16, wherein the first thickness is greater than the second thickness; and a difference between the first thickness and the second thickness being less than 50 μm.

19. The display apparatus of claim 12, wherein a thickness of the glass is in a range of 30 μm to 100 μm; and a ratio of a thickness of the opaque filler layer to the thickness of the glass is in a range of 2.5 to 3.5.

20. The display apparatus of claim 12, wherein the cover is bendable along a bending direction; and an absorption axis of the polarizer is substantially perpendicular to the bending direction.

\* \* \* \* \*